April 20, 1943. N. P. CASE Re. 22,302

SIGNAL-TRANSLATING SYSTEM

Original Filed Nov. 13, 1940

INVENTOR
NELSON P. CASE

BY Laurence B. Dodds
ATTORNEY

Reissued Apr. 20, 1943 Re. 22,302

UNITED STATES PATENT OFFICE 22,302

SIGNAL-TRANSLATING SYSTEM

Nelson Perry Case, Great Neck, N. Y., assignor to Hazeltine Corporation, a corporation of Delaware Original No. 2,264,019, dated November 25, 1941, Serial No. 365,459, November 13, 1940. Application for reissue January 28, 1943, Serial No. 473,863

11 Claims. (Cl. 250—20)

Figures 1, 2, 3, 4:
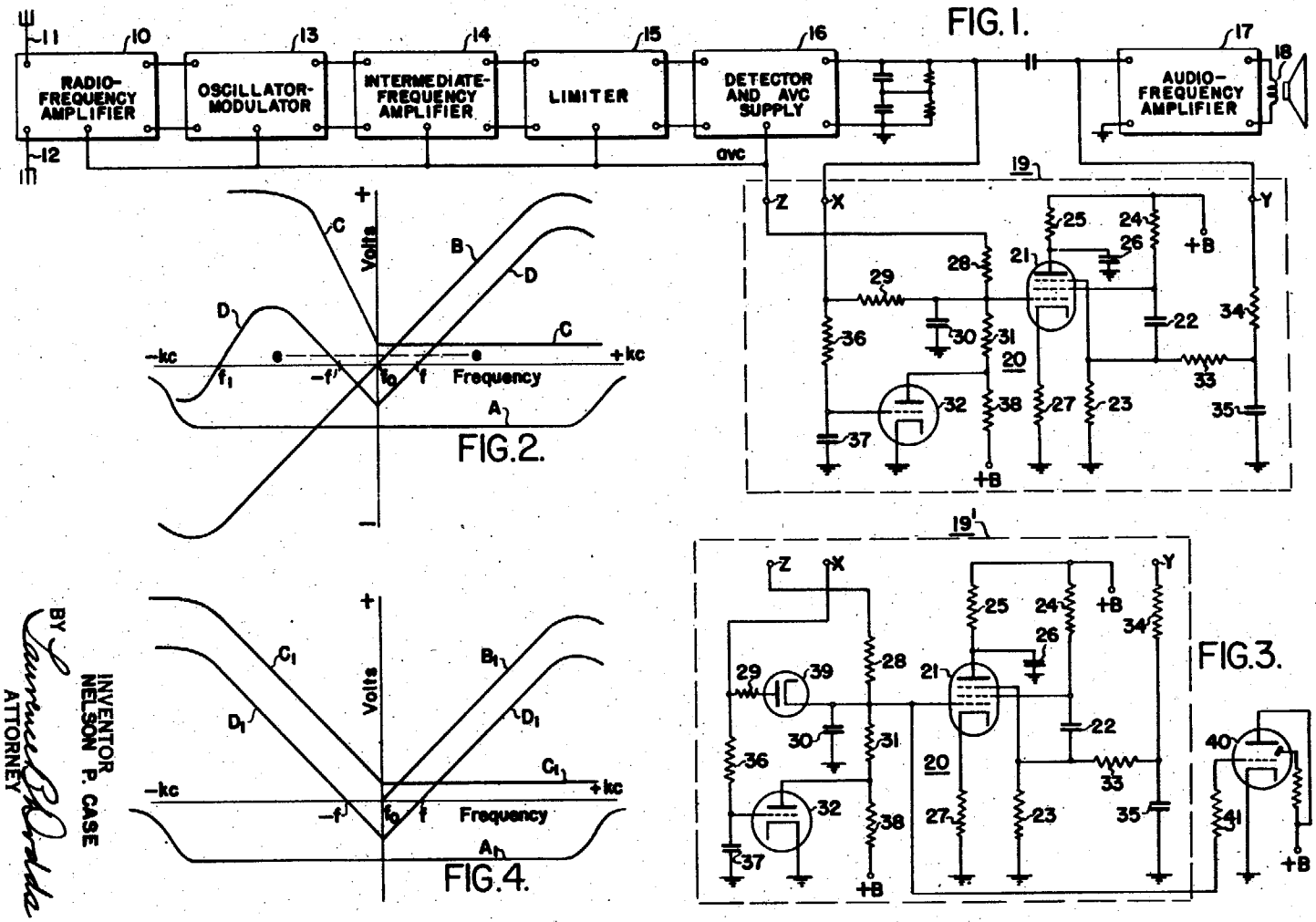

The present invention relates to signal-translating systems and, more particularly, to such systems having a controllable translating characteristic. While the invention is of general application, it has particular utility for use in a frequency-modulated carrier-signal receiver for controlling the amplification of a signal amplifier to silence the receiver whenever it is detuned from a desired carrier signal and the invention will, therefore, be described in that connection.

It is desirable to incorporate in a modulated-carrier signal receiver an arrangement for silencing the receiver during intervals when the signal input to the detector is below the predetermined level necessary for satisfactory reproduction, either because the received signal is near the prevailing noise level or because the receiver is appreciably mistuned from a strong desired signal, in which latter case the reproduction of signals is also distorted by such mistuning. The silencing of a frequency-modulated carrier-signal receiver when the receiver is appreciably mistuned from a desired carrier signal is additionally desirable to suppress the reproduction of the spurious responses resulting from the frequency-responsive characteristic of the carrier-signal channels provided in the receiver.

Many of the prior art noise suppression systems heretofore used in amplitude-modulated carrier-signal receivers are not adaptable for use in frequency-modulated carrier-signal receivers. The former class of receivers include means for deriving from a received carrier signal an automatic amplification control bias or equivalent, which is generally used also to contral the operation of the noise suppression system if included in the receiver. The automatic amplification control bias developed in a frequency-modulated carrier-signal receiver, on the other hand, is not suitable to control a noise suppression system of the prior art since it has a substantially constant amplitude over a broad tuning range on either side of a desired carrier signal. This constant-amplitude characteristic results from the broad pass-band characteristic of the carrier-signal amplifiers necessarily used in frequency-modulated carrier-signal receivers. Any attempt to narrow the range over which the automatic amplification control bias or equivalent is substantially constant has generally proven unsatisfactory since any such attempt must be predicated upon the integration of the energy of the modulated-carrier signal only at and in proximity to its mean frequency and it is well known that such carrier signals have a relatively small portion of their total energy concentrated within this limited frequency base. Moreover, the sharply-tuned circuit necessary to provide the limited constant-amplitude range of the automatic amplification control bias can be maintained in proper alignment with the frequency detector of the receiver only with exceedingly great difficulty.

It is an object of the present invention, therefore, to provide a new and improved signal-translating system having a controllable translation characteristic and one which avoids one or more of the above-mentioned disadvantages and limitations of the prior art systems.

It is a further object of the invention to provide a signal-translating system wherein a signal-translating characteristic of the system is controlled in accordance with variations of the mean frequency of a frequency-modulated carrier signal from a predetermined frequency.

It is an additional object of the invention to provide a signal-translating system wherein variations of a characteristic of a frequency-modulated carrier signal from a predetermined value control the operation of an oscillation generator, the output of which controls, in turn, a characteristic of the signal-translating system.

In accordance with the invention, a signal-translating system comprises an input circuit adapted to have signals applied thereto, and a signal-translating channel coupled to the input circuit. The system includes means for deriving a first unidirectional potential the magnitude of which varies with a characteristic of a signal applied to the input circuit, and means for deriving a second unidirectional potential the magnitude and polarity of which vary with variations of the signal characteristic in opposite senses from a predetermined value. The system additionally is provided with a source of oscillations, means responsive jointly to the derived unidirectional potentials for modifying a characteristic of the oscillations of the source, and means responsive to the characteristic of the oscillations for controlling a characteristic of the signal-translating channel.

For a better understanding of the present invention, together with other and further objects thereof, reference is had to the following description taken in connection with the accompanying drawing and its scope will be pointed out in the appended claims.

Referring now to the drawing, Fig. 1 is a circuit diagram, partly schematic, of a complete frequency-modulated carrier-signal receiver embodying the invention; Fig. 2 is a graph comprising curves representing frequency-voltage relations occurring at certain points in the arrangement of Fig. 1 and is used as an aid in explaining the operation of the latter; Fig. 3 is a circuit diagram representing a modified form of the invention; and Fig. 4 is a graph comprising curves representing frequency-voltage relations occurring at certain points in the arrangement of Fig. 3.

Referring now more particularly to Fig. 1, there is represented schematically a complete frequency-modulated carrier-signal receiver of a conventional design embodying the present invention in a preferred form. In general, the receiver includes a radio-frequency amplifier 10 having its input circuit connected to an antenna system 11, 12 and having its output circuit connected to an oscillator-modulator 13. Connected in cascade with the oscillator-modulator 13, in the order named, are an intermediate-frequency amplifier 14 of one or more stages, an amplitude limiter 15, a frequency-modulation detector and A. V. C. supply 16, an audio-frequency amplifier 17 of one or more stages, and a sound reproducer 18. Coupled to the A. V. C. supply and to the output of the frequency-modulation detector of unit 16 is an automatic control system 19, more fully described hereinafter, the output of which is coupled to a control electrode of one or more of the tubes of the audio-frequency amplifier 17. An automatic amplification control or A. V. C. circuit is connected between the output of the A. V. C. supply of unit 16 and the control electrodes of one or more of the tubes of the radio-frequency amplifier 10, the oscillator-modulator 13, and the intermediate-frequency amplifier 14, in conventional manner.

It will be understood that the various units 10—19, inclusive, just described may, with the exception of the unit 19 presently to be considered, be of a conventional construction and operation, the details of which are well known in the art, rendering detailed description thereof unnecessary. Considering briefly the operation of the receiver as a whole, and neglecting for the moment the operation of the automatic control system 19, presently to be described, a desired frequency-modulated carrier signal is selected and amplified by the radio-frequency amplifier 10, converted to a frequency-modulated intermediate-frequency carrier signal in the oscillator-modulator 13, amplified in the intermediate-frequency amplifier 14, limited to a predetermined substantially constant amplitude by the limiter 15, and detected by the frequency-modulation detector of unit 16, thereby to derive the audio-frequency modulation components. The audio-frequency components are, in turn, amplified in the audio-frequency amplifier 17 and are reproduced by the sound reproducer 18 in a conventional manner.

The automatic amplification control or A. V. C. bias derived from the A. V. C. supply of unit 16 is effective to control the amplification of one or more of the units 10, 13, and 14 to maintain the signal input to the limiter 15 within a relatively narrow range for a wide range of received signal intensities.

Referring now more particularly to the portion of the system embodying the present invention, the audio-frequency amplifier 17 comprises a signal-translating channel and it is desirable that a characteristic of the channel be controlled in accordance with a characteristic of the carrier signal applied from the limiter 15 to the input circuit of unit 16. More specifically, it is desired that the amplification of the audio-frequency amplifier 17 be controlled in accordance with either or both the intensity of a received carrier signal and the difference between the mean frequency of the frequency-modulated intermediate-frequency carrier signal and that of band-pass selectors of the receiver, the control being such that the receiver is silenced when the received carrier-signal intensity is too low or the aforesaid frequency difference has a value corresponding to a predetermined mistuning of the receiver from a desired carrier signal. To this end, the A. V. C. supply of unit 16 comprises means for deriving a unidirectional potential the magnitude of which varies with a characteristic of the frequency-modulated intermediate-frequency carrier signal applied to the input circuit of unit 16. The frequency-modulation detector of unit 16 comprises means for deriving a second unidirectional potential, the magnitude and polarity of which vary with variations of the frequency of the intermediate-frequency signal carrier on either side of the mean frequency of the selector circuits. In this connection, it will be appreciated that the frequency of the intermediate-frequency signal deviates over a predetermined range centered about its mean or nominal frequency.

The automatic amplification control system 19 includes a source of oscillations comprising an oscillation generator 20 which may be of any well-known type, but is shown as a single tube multivibrator of the type disclosed in United States Letters Patent No. 2,203,519, granted June 4, 1940 to Madison Cawein. Briefly, the generator 20 comprises a vacuum tube 21 of the pentode type having its screen and suppressor directly coupled together through a condenser 22, the suppressor being provided with a grid leak 23. The screen and anode of tube 21 are energized from a source of space current +B through suitable load resistors 24 and 25, respectively. A condenser 26 is connected between the anode and ground, the condenser being periodically and alternately charged through the anode load resistor 25 from the space current source +B and discharged through tube 21. A cathode-bias resistor 27 is included in the cathode lead while the control grid of tube 21 is coupled through a resistor 28 to the A. V. C. supply of unit 16, is coupled through a filter circuit comprising a series resistor 29 and a shunt condenser 30 to the output of the frequency detector of unit 16, and, lastly, is coupled through a resistor 31 to the anode of a direct current amplifier tube 32. A negative-bias potential is developed across the suppressor grid-leak resistor 23 when the tube 21 is generating oscillations and this potential is applied through a filter network comprising a series resistor 33 and a shunt condenser 35 and through a resistor 34 to an amplification control circuit of the audio-frequency amplifier 17. In practice, the amplification control circuit of unit 17 generally comprises the control-grid circuit of the first amplifier stage of unit 17.

The input circuit of the direct current amplifier 32 is coupled through an audio-frequency filter network comprising a series resistor 36 and shunt condenser 37 to the output circuit of the frequency detector of unit 16. The output circuit of amplifier 32 includes a load resistor 38 and a source of space current +B. Positive values of potential applied from the output of the frequency detector of unit 16 to the control grid of amplifier 32 develop a large potential drop across resistor 36 by grid rectification and consequently are not reproduced in the output of amplifier 32. Negative values of the detector output potential are amplified, however, thereby to derive in the output of amplifier 32 a unidirectional potential having positive polarity. Thus, amplifier 32 comprises means responsive to the detector unidirectional potential output of one polarity for deriving a second unidirectional potential of opposite polarity. That is, amplifier 32 comprises means for deriving a unidirectional potential, the magnitude of which varies with variations in one sense of the frequency of the signal carrier from a predetermined value, the polarity of this potential and the sense of variation thereof being opposite to that of the detector output potential with variation in the one sense of the signal-carrier frequency from the aforesaid predetermined value.

In considering the operation of the circuit just described, reference may be had to the aforementioned Patent 2,203,519 for a description of the detailed operation of the oscillation generator 20, per se. Briefly, however, for purposes of the present description of the system operation, it may be stated that the anode current of generator 20 is of pulse wave form and that the generator generates a voltage of substantially saw-tooth wave form across the condenser 26 in its output circuit. The oscillations of the anode circuit cause a potential of pulse wave form to be produced in the circuit of the screen grid, which potential is applied through condenser 22 to develop across the suppressor grid resistor 23 an alternating potential having small positive half-cycles and relatively large negative half-cycles. This particular type of generator possesses the important characteristic that the amplitude of the output saw-tooth oscillations developed, and the grid bias developed across grid resistor 23 by grid rectification, are, for purposes of the present invention, substantially independent of variations of bias applied to the input electrodes of the generator.

The generator 20 possesses the additional important characteristic that the generation of oscillations is suddenly terminated when the negative biasing potential applied to the control grid of tube 21 exceeds a predetermined magnitude and the generator remains inactive until such negative bias is reduced to a value lower than that at which the generator ceased to oscillate. Thus, this type of generator has, more or less inherently, the property of either oscillating strongly or not at all, and changes in the magnitude of the control-grid bias do not, insofar as the purposes of the present invention are concerned, change the amplitude of the generated oscillations except by a form of switch action from zero amplitude to full amplitude, or vice versa. Therefore, the speed of control of generator 20 is controlled only by the effective time constant of its input circuit, comprising the circuit elements 28, 29, 30, 31, 36, 37, 38 and the circuit elements included in the output circuits of the A. V. C. supply and the frequency detector of unit 16, and by the time constant of its output circuit, comprising the circuit elements 23, 33, 34, 35 and the circuit elements included in the control circuit of unit 17. These time constants can be made so small that, to the ear, the initiation or termination of the generation of oscillations is substantially instantaneous.

It follows, from the definite "on-off" action of generator 20 that there is no transition period where generator 20 is partially operating. Since it is the presence of a transition region which causes distortion at a critical carrier-signal intensity, or critical value of frequency of the intermediate-frequency carrier signal, it is apparent that the control system 19 is free from such distortion. Obviously, there also can be no undesirable volume control effect when the automatic control bias applied to unit 17 is either normal or far beyond cutoff. This further advantage of the present invention follows from the lack of a transition region.

Assuming that the intensity of a received carrier signal is constant, the curves of Fig. 2 show the magnitudes of the unidirectional potentials developed by the frequency detector and by the A. V. C. supply of unit 16, that developed in the output circuit of amplifier 32, and the approximate resultant control bias applied to the grid of oscillation generator 20 with variations of frequency of the intermediate-frequency carrier signal, the value of the approximate resultant control bias being arrived at under the assumption that no grid current is drawn by generator 20 when the grid is biased positively. Curve A represents the unidirectional potential derived by the A. V. C. supply of unit 16, the magnitude of this potential usually being substantially constant, as indicated, over the range of frequency deviation of the intermediate-frequency carrier signal. Curve B represents the unidirectional potential derived from the intermediate-frequency carrier signal by the frequency detector of unit 16 which, it is seen, varies linearly but in opposite senses, on either side of the mean resonant frequency $f_0$ of the selector circuit of unit 16. This latter potential is applied to the input circuit of amplifier 32 and there is derived at the anode thereof a unidirectional potential represented by curve C. From curve C it will be seen that the potential of the anode of amplifier 32 is at all times positive, but has a low substantially constant value during the time that the output potential of the frequency detector 16 is positive, due to the large potential drop developed across resistor 36 by grid current of the amplifier 32, and that the anode potential increases linearly with frequency for increasingly negative values of detector output potential. Since the outputs of the A. V. C. supply and the frequency detector of unit 16 and the output of amplifier 32 are all applied to the control grid of generator 20, the resultant potential applied to the control grid is a resultant voltage, the values of which are generally represented by curve D of Fig. 2. It will be seen from the resultant curve D that the control grid of generator 20 is negative as long as the frequency of the intermediate-frequency signal carrier lies within the limited frequency range $f$ to $-f$ and that the control grid is positively biased for other values of frequency of the intermediate-frequency carrier signal.

The oscillation generator 20 suddenly breaks into oscillation when a small positive potential, represented in Fig. 2 by the potential $e$, is applied to its control grid and suddenly ceases oscillating when its control grid is negatively biased. From this, it is evident that no bias is developed across the suppressor grid resistor 23, and the audio-frequency amplifier 17 consequently has normal amplifications, during the time when the mean frequency of the intermediate-frequency carrier signal lies substantially within the frequency range $f$ to $-f$. It may here be noted that, while nal deviates over a range wider than the limited range $f$ to $-f$ by virtue of its frequency modulation, so that it might appear that the resultant control voltage would momentarily go positive from time to time, this effect is avoided by filtering out the modulation components by the filter networks 36, 37 and 29, 30. When the mean frequency of the intermediate-frequency signal carrier lies outside of the frequency range $f$ to $-f$, the grid of generator 20 is biased positively, it oscillates in a normal manner, a large negative the frequency of the intermediate-frequency sig- bias is developed across the suppressor grid resistor 23, and the audio-frequency amplifier 17 is biased beyond cutoff, thereby silencing the receiver.

The receiver is similarly silenced in the event that a desired received carrier signal does not have sufficient intensity to ensure satisfactory reproduction, the operation being substantially the same as in the foregoing described operation except that the slope of the detector output characteristic, represented by curve B of Fig. 2, is not as great for carrier signals of low intensity and the magnitude of the A. V. C. bias, represented by curve A of Fig. 2, is correspondingly smaller. Thus it will be evident that generator 20 continues to oscillate, thereby silencing the receiver, until such time as the received carrier signal is accurately tuned in and has a sufficiently large intensity that the negative bias derived by the A. V. C. supply of unit 16 is larger in magnitude than the positive bias applied to the control grid of tube 21 from amplifier 32.

From the foregoing description of the operation of the invention, it will be seen that the control grid of generator 20 and its associated control circuit comprise means responsive to the unidirectional potentials derived by the A. V. C. supply and frequency detector of unit 16 for modifying the amplitude characteristic of the oscillations of generator 20. The control circuit of unit 17 is responsive to such amplitude characteristic of the generated oscillations for controlling the amplifying characteristic of the audio-frequency amplifier 17. It will further be seen that the detector and A. V. C. supply of unit 16 and the amplifier 32 together constitute means responsive to the frequency characteristic of the intermediate-frequency signal carrier for deriving a unidirectional potential having a negative polarity when the frequency characteristic of the signal carrier has a predetermined range of values and having a positive polarity when the value of the carrier frequency is above or below the predetermined range of values.

It is evident from curve D of Fig. 2 that the bias applied to the control grid of generator 20 may become negative, thereby to allow the audio-frequency amplifier 17 to operate with full output, in the event that the receiver is so badly mistuned from the desired carrier signal that the mean frequency of the intermediate-frequency signal carrier departs farther than a frequency $f_1$ from the desired intermediate frequency. This, of course, is a condition of operation which in certain cases may be undesirable and which arises from the fact that the potential of the anode of amplifier 32 increases only to a predetermined value of potential; thereafter, increasingly larger negative values of detector output eventually bias the grid of generator 20 negatively, as indicated by curve D. Such an operating condition is avoided by the arrangement of Fig. 3 which is a circuit diagram representing a modified form of the automatic control system essentially similar to the corresponding system 19 of Fig. 1, similar circuit elements being designated by similar reference characters. In this embodiment the negative values of unidirectional potential developed in the output of the detector of unit 16 are prevented from reaching the control grid of generator 20 by the insertion of a unilaterally conductive or rectifier device 39 in the coupling circuit between the output of the detector of unit 16 and the control grid of generator 20. Thus, the rectifier device 39 comprises means for deriving from the detector output potential a unidirectional potential having zero value when the frequency of the signal carrier is below a predetermined value and having a given polarity when the signal-carrier frequency is above this predetermined value. The arrangement of Fig. 2 also includes a tuning indicator device, which may be of the 6E5 type of vacuum tube, the control grid of which is coupled through a resistor 41 to the control grid of tube 21. The tuning indicator device 40 is energized from a source of space current +B.

The operation of this modified form of the invention is essentially similar to that of the Fig. 1 arrangement except that only positive values of unidirectional potential are applied from the detector of unit 16 to the control grid of generator 20 by virtue of the unilaterally conductive properties of the device 39. Assuming that the intensity of a received carrier signal is constant, the curves of Fig. 4 show the several unidirectional voltages and the resultant unidirectional voltage applied to the control grid of generator 20, the value of the resultant voltage being arrived at under the assumption, as before, that the grid of generator 20 does not draw grid current when positively biased. Curve $A_1$ represents the unidirectional potential applied to the control grid from the A. V. C. supply of unit 16. Curve $B_1$ represents the unidirectional potential applied to the control grid from the detector of unit 16, there being only positive values of this voltage by virtue of the device 39. Curve $C_1$ represents the unidirectional voltage applied to the control grid from the output of amplifier 32. The magnitude of the resultant of these several voltages is represented, in general, by curve $D_1$ from which it is evident that the control grid of generator 20 can become negative only when the intermediate-frequency signal carrier has a mean frequency lying within the limited frequency range $f$ to $-f$. Consequently, the receiver is silenced at all times except when the intermediate-frequency signal carrier has a frequency very close to that of the desired intermediate frequency. Thus, amplifier 32 and the rectifier device 39 comprise means for deriving from the unidirectional voltage of the detector of unit 16 a second unidirectional voltage the magnitude of which varies positively from a predetermined value with variations of the frequency of the intermediate-frequency signal carrier in opposite senses from the predetermined desired intermediate frequency.

The bias applied to the control grid of tube 21 is also applied to the grid of the tuning indicator device 40 thereby to change the shadow angle of this device in accordance with the tuning of the receiver to a desired carrier signal, the shadow angle being a minimum when the receiver accurately is tuned to the desired carrier signal. Thus, the condition of tuning of the receiver to a desired carrier signal is audibly indicated by the operation of the audio amplifier 17 under control of the resultant control potential applied to the control grid of tube 21 and is visually indicated by the operation of the tuning indicator device 40 under control of the same control potential.

It will be evident from the above description of the invention that the arrangements of both Figs. 1 and 3 maintain the output of the receiver silenced while tuning between carrier-signal channels. Thus, in the arrangement of Fig. 3, when the receiver is appreciably detuned from a carrier signal, the output of both the detector and A. V. C. supply of unit 16 is zero and the only bias applied to the control grid of vacuum tube 21 is a small constant positive bias derived from the output of the amplifier 32. This positive bias, of course, causes the generator 20 to generate oscillations, thereby to produce a negative bias across the resistor 23 which blocks the audio-frequency amplifier 17 to silence the output of the receiver. This described operation applies also to the Fig. 1 arrangement except for a small range of carrier-signal frequencies in the vicinity of the frequency $f_1$, Fig. 2, where, as explained above, the generator 20 may cease to generate oscillations due to the negative values of curve D for such frequencies.

While in the arrangements of Figs. 1 and 3 the negative bias applied through the resistor 28 to the control grid of tube 21 is derived from the A. V. C. supply of unit 16, this bias may alternatively be derived from a source of constant potential, as, for example, a battery. However, where the bias is derived from a source of constant potential, the bias applied to the control grid of tube 21 is negative and has the same value either when the receiver is accurately tuned to a desired carrier signal or when the receiver is not tuned to any carrier signal as when tuned between carrier-signal transmission channels. In certain cases, this type of operation may be undesirable since the resultant negative bias applied to the control grid of tube 21 causes the generator 20 to cease generating oscillations, whereby the audio-frequency amplifier 17 has normal amplification, whenever the receiver is not tuned to proximity with a carrier signal. Thus interchannel noise is received when tuning between stations, a condition of operation which is avoided by the arrangements of Figs. 1 and 3.

As illustrative of a specific embodiment of the invention, the following circuit constants are given for an embodiment of the invention shown in Fig. 1:

| | | |
|---|---|---|
| Vacuum tube 21 | | Type 6SJ7 |
| Vacuum tube 32 | | Type 6SF5 |
| Resistor 23 | megohm | 1 |
| Resistor 24 | ohms | 68,000 |
| Resistor 25 | do | 50,000 |
| Resistor 27 | do | 220 |
| Resistor 28 | do | 670,000 |
| Resistor 29 | megohms | 1 |
| Resistor 31 | do | 15 |
| Resistor 33 | do | 3 |
| Resistor 34 | do | 10 |
| Resistor 36 | do | 1 |
| Resistor 38 | do | 15 |
| Condenser 22 | micro-microfarads | 3,000 |
| Condenser 26 | do | 2,000 |
| Condenser 30 | microfarad | 0.02 |
| Condenser 35 | do | 0.01 |
| Condenser 37 | do | 0.02 |
| +B | volts | 250 |
| Mean intermediate frequency | megacycles | 4.3 |

The circuit constants for an embodiment of the modified form of the invention shown in Fig. 3 were the same as those given for the Fig. 1 arrangement except as follows:

| | | |
|---|---|---|
| Resistor 28 | megohms | 3.3 |
| Condenser 30 | microfarad | 0.01 |
| Device 39 | | Type 6H6 vacuum tube |

While there have been described what are at present considered to be the preferred embodiments of this invention, it will be obvious to those skilled in the art that various changes and modifications may be made therein without departing from the invention, and it is, therefore, aimed in the appended claims to cover all such changes and modifications as fall within the true spirit and scope of the invention.

What is claimed is:

1. A signal-translating system comprising, an input circuit adapted to have signals applied thereto, a signal-translating channel coupled to said input circuit, means for deriving a first unidirectional potential the magnitude and polarity of which vary with variations of a characteristic of an applied signal in opposite senses from a predetermined value, means for deriving a second unidirectional potential the magnitude of which varies with variations in one sense of said characteristic from said predetermined value, the polarity of said last-named potential and the sense of variation thereof being opposite to that of said first-named potential with variations in said one sense of said characteristic from said predetermined value, and means responsive jointly to said derived unidirectional potentials for controlling a characteristic of said signal-translating channel.

2. A signal-translating system comprising, an input circuit adapted to have signals applied thereto, a signal-translating channel coupled to said input circuit, means responsive to a characteristic of an applied signal for deriving a unidirectional potential having one polarity when said characteristic is below a predetermined value and having opposite polarity when said characteristic is above said predetermined value, means for deriving from said unidirectional potential of said one polarity a second unidirectional potential having said opposite polarity, and means responsive jointly to said unidirectional potentials of said opposite polarity for controlling a characteristic of said signal-translating channel.

3. A signal-translating channel comprising, an input circuit adapted to have signals applied thereto, a signal-translating channel coupled to said input circuit, means responsive to a characteristic of an applied signal for deriving a unidirectional control potential having one polarity when said characteristic has a predetermined value and having opposite polarity when the value of said characteristic differs above or below said value by a predetermined amount, a source of oscillations, means responsive to said derived unidirectional potential for modifying a characteristic of the oscillations of said source, and means responsive to said characteristic of said oscillations for controlling a characteristic of said signal-translating channel.

4. A signal-translating system comprising, an input circuit adapted to have signals applied thereto, a signal-translating channel coupled to said input circuit, means for deriving a first unidirectional potential the magnitude and polarity of which vary with variations of a characteristic of an applied signal in opposite senses from a predetermined value, means for deriving a second unidirectional potential the magnitude of which varies with variations in one sense of said characteristic from a predetermined value, the polarity of said last-named potential and the sense of the variations of magnitude thereof being opposite to that of said first unidirectional potential with variations in said one sense of said characteristic from said predetermined value, a source of oscillations, means responsive jointly to said derived unidirectional potentials for modifying a characteristic of the oscillations of said source, and means responsive to said characteristic of said oscillations for controlling a characteristic of said signal-translating channel.

5. A signal-translating system comprising, an input circuit adapted to have signals applied thereto, a signal-translating channel coupled to said input circuit, means responsive to a characteristic of an applied signal for deriving a unidirectional potential having one polarity when said characteristic is below a predetermined value and having opposite polarity when said characteristic is above said predetermined value, means for deriving from said unidirectional potential of said one polarity a second unidirectional potential having said opposite polarity, a source of oscillations, means responsive jointly to said unidirectional potentials of said opposite polarity for modifying a characteristic of the oscillations of said source, and means responsive to said characteristic of said oscillations for controlling a characteristic of said signal-translating channel.

6. A signal-translating system comprising, an input circuit adapted to have signals applied thereto, a signal-translating channel coupled to said input circuit, means responsive to a characteristic of an applied signal for deriving a unidirectional potential having one polarity when said characteristic is below a predetermined value and having opposite polarity when said characteristic is above said predetermined value, a direct current amplifier having an input circuit coupled to said last-named means and having an output circuit in which is derived from said unidirectional potential of said one polarity a second unidirectional potential having said opposite polarity, a source of oscillations, means responsive jointly to said unidirectional potentials of said opposite polarity for modifying a characteristic of the oscillations of said source, and means responsive to said characteristic of said oscillations for controlling a characteristic of said signal-translating channel.

7. A signal-translating system comprising, an input circuit adapted to have carrier signals applied thereto, a signal-translating channel coupled to said input circuit, a frequency detector coupled to said input circuit for deriving from an applied signal a unidirectional potential having one polarity when the frequency of said carrier signal is below a predetermined frequency and having opposite polarity when the value of said carrier-signal frequency is above a predetermined frequency, an audio-frequency filter network, a direct current amplifier coupled through said network to said frequency detector for deriving from said unidirectional potential of said one polarity a second unidirectional potential having said opposite polarity, a source of oscillations, means responsive jointly to said derived unidirectional potentials of said opposite polarities for modifying a characteristic of the oscillations of said source, and means responsive to said characteristic of said oscillations for controlling a characteristic of said signal-translating channel.

8. A signal-translating system comprising, an input circuit adapted to have signals applied thereto, a signal amplifier coupled to said input circuit, means for deriving a first unidirectional potential the magnitude and polarity of which vary with variations of a characteristic of an applied signal in opposite senses from a predetermined value, means for deriving a second unidirectional potential the magnitude of which varies with variations in one sense of said characteristic from said predetermined value, the polarity of said second unidirectional potential and the sense of variation of the magnitude thereof being opposite to that of said first unidirectional potential with variations in said one sense of said characteristic from said predetermined value, a source of oscillations, means responsive jointly to said derived unidirectional potentials for modifying a characteristic of the oscillations of said source, and means responsive to said characteristic of said oscillations for controlling the amplification of said signal amplifier.

9. A signal-translating system comprising, an input circuit adapted to have signals applied thereto, a signal-translating channel coupled to said input circuit, means responsive to a characteristic of an applied signal for deriving a first unidirectional potential having one polarity when said characteristic is below a predetermined value and having opposite polarity when said characteristic is above said predetermined value, means for deriving from said first unidirectional potential of said one polarity a second unidirectional potential having said opposite polarity, means for deriving from said first unidirectional potential a third unidirectional potential having zero value when said characteristic is below said predetermined value and having said opposite polarity when said characteristic is above said predetermined value, a source of oscillations, means responsive jointly to said second and third unidirectional potentials for modifying a characteristic of the oscillations of said source, and means responsive to said characteristic of said oscillations for controlling a characteristic of said signal-translating channel.

10. A signal-translating system comprising, an input circuit adapted to have signals applied thereto, a signal-translating channel coupled to said input circuit, means responsive to a characteristic of an applied signal for deriving a first unidirectional potential having one polarity when said characteristic is below a predetermined value and having opposite polarity when said characteristic is above said predetermined value, means for deriving from said first unidirectional potential of said one polarity a second unidirectional potential having said opposite polarity, means including a unilaterally conductive device for deriving from said first unidirectional potential a third unidirectional potential having zero value when said characteristic is below said predetermined value and having said opposite polarity when said characteristic is above said predetermined value, a source of oscillations, means responsive jointly to said second and third unidirectional potentials for modifying a characteristic of the oscillations of said source, and means responsive to said characteristic of said oscillations for controlling a characteristic of said signal-translating channel.

11. A signal-translating system comprising, an input circuit adapted to have signals applied thereto, a signal-translating channel coupled to said input circuit, means for deriving a first unidirectional potential the magnitude of which varies with a characteristic of an applied signal, means responsive to a characteristic of said applied signal for deriving a second unidirectional potential having one polarity when said last-named characteristic is below a predetermined value and having opposite polarity when said last-named characteristic is above said predetermined value, means for deriving from said second unidirectional potential of said one polarity a third unidirectional potential having said opposite polarity, a source of oscillations, means responsive jointly to said first, second, and third unidirectional potentials for modifying a characteristic of the oscillations of said source, and means responsive to said characteristic of said oscillations for controlling a characteristic of said signal-translating channel.

NELSON PERRY CASE.